United States Patent
Chung et al.

(10) Patent No.: US 7,592,210 B2
(45) Date of Patent: Sep. 22, 2009

(54) SEMICONDUCTOR DEVICE WITH INCREASED CHANNEL AREA AND DECREASED LEAKAGE CURRENT

(75) Inventors: Sung Woong Chung, Gyeonggi-do (KR); Sang Don Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 521 days.

(21) Appl. No.: 11/480,999

(22) Filed: Jul. 6, 2006

(65) Prior Publication Data
US 2007/0221991 A1 Sep. 27, 2007

(30) Foreign Application Priority Data
Mar. 23, 2006 (KR) .................. 10-2006-0026511

(51) Int. Cl.
*H01L 21/84* (2006.01)
(52) U.S. Cl. .............. 438/156; 438/270; 257/E21.629
(58) Field of Classification Search ........... 438/156, 438/270, 271; 257/E21.629
See application file for complete search history.

(56) References Cited

U.S. PATENT DOCUMENTS

| 6,239,465 B1 | 5/2001 | Nakagawa |
| 6,285,057 B1 * | 9/2001 | Hopper et al. .......... 257/330 |
| 6,358,800 B1 | 3/2002 | Tseng |
| 7,247,905 B2 * | 7/2007 | Cheng et al. .......... 257/302 |
| 2005/0233513 A1 | 10/2005 | Kim et al. |

FOREIGN PATENT DOCUMENTS

KR   1020050034879 A   4/2005

* cited by examiner

*Primary Examiner*—Chandra Chaudhari
(74) *Attorney, Agent, or Firm*—Townsend and Townsend and Crew LLP

(57) ABSTRACT

The semiconductor device includes an active region, a recess channel region including vertical channel structures, a gate insulating film, and a gate structure. The active region is defined by a device isolation structure formed in a semiconductor substrate. The recess channel region is formed in the active region. The vertical silicon-on-insulator (SOI) channel structures are disposed at sidewalls of both device isolation structures in a longitudinal direction of a gate region. The gate insulating film is disposed over the active region including the recess channel region. The gate structure is disposed over the recess channel region of the gate region.

26 Claims, 12 Drawing Sheets

(i)

(ii)

(i)

(ii)

SEMICONDUCTOR DEVICE WITH INCREASED CHANNEL AREA AND DECREASED LEAKAGE CURRENT

CROSS-REFERENCES TO RELATED APPLICATIONS

The present application claims priority to Korean patent application No. 10-2006-0026511, filed on Mar. 23, 2006, which is incorporated by reference in its entirety.

BACKGROUND OF THE INVENTION

The present invention relates to a memory device. More particularly, the present invention relates to a semiconductor device and a method for fabricating the same having a recess channel region including vertical silicon-on-insulator (SOI) channel structures.

When a channel length of a cell transistor is decreased, the ion concentration of a cell channel region is generally increased in order to maintain the threshold voltage of the cell transistor. An electric field in source/drain regions of the cell transistor is enhanced to increase the leakage current. This results in degradation of the refresh characteristics of the dynamic random access memory (DRAM) structure. Therefore, there is a need for semiconductor devices in which the refresh characteristics are improved.

FIG. 1 is a simplified layout of a semiconductor device, wherein reference numerals 1 and 3 denote an active region, which is defined by a device isolation structure 30, and a gate region, respectively.

FIGS. 2a through 2c are simplified cross-sectional views illustrating a method for fabricating a semiconductor device, wherein FIGS. 2a through 2c are cross-sectional views taken along the line I-I' of FIG. 1.

Referring to FIG. 2a, a semiconductor substrate 10 having a pad insulating film (not shown) is etched using a device isolation mask (not shown) to form a trench (not shown) defining a Fin-type active region 20. An insulating film for device isolation (not shown) is formed to fill the trench. The insulating film for device isolation is polished until the pad insulating film is exposed to form a device isolation structure 30. The pad insulating film is removed to expose the top surface of the Fin-type active region 20.

Referring to FIG. 2b, a predetermined thickness of the device isolation structure 30 is etched using a recess gate mask (not shown) defining a gate region 3 shown in FIG. 1 to protrude an upper part of the Fin-type active region 20 over the device isolation structure 30.

Referring to FIG. 2c, a gate insulating film 60 is formed over the protruded Fin-type active region 20. A gate structure 90 is formed over the gate insulating film 60 of the gate region 3 shown in FIG. 1 to fill the protruded Fin-type active region 20, wherein the gate structure 90 comprises a stacked structure of a gate electrode 70 and a gate hard mask layer pattern 80.

FIG. 3 is a simplified cross-sectional view illustrating a semiconductor device.

Referring to FIG. 3, if a voltage above the threshold voltage is applied to the gate, an inversion layer IL and a depletion region DR are formed in a semiconductor substrate 10 under the gate insulating film 60.

According to the above conventional method for fabricating a semiconductor device, the device isolation structure of the gate region is etched to protrude the Fin-type active region, which necessarily causes loss of the protruded Fin-type active region during a subsequent cleaning process including hydrogen fluoride (HF). Accordingly, it is difficult to pattern the gate structure due to its increased complexity.

BRIEF SUMMARY OF THE INVENTION

The present invention relates to a semiconductor device and a method for fabricating the same wherein a recess channel region including vertical silicon-on-insulator (SOI) channel structures, which are disposed at sidewalls of both device isolation structures under a gate in a longitudinal direction of a gate region, is formed, thereby increasing a channel area of the device and decreasing its leakage current. Accordingly, the short channel effect (SCE) and refresh characteristics of the device can be improved.

According to an embodiment of the present invention, a semiconductor device includes: a device isolation structure formed in a semiconductor substrate to define an active region; a recess channel region including vertical silicon-on-insulator (SOI) channel structures formed in the active region, wherein the vertical silicon-on-insulator (SOI) channel structures are disposed at sidewalls of both device isolation structures in a longitudinal direction of a gate region; and a gate structure is disposed over the recess channel region of the gate region.

According to another embodiment of the present invention, a method for fabricating a semiconductor device includes: (a) forming a device isolation structure in a semiconductor substrate having a pad insulating film; (b) selectively etching the pad insulating film by a recess gate mask to expose the semiconductor substrate of a recess region; (c) forming a first spacer at a sidewall of the recess region; (d) etching a predetermined thickness of the semiconductor substrate exposed at the lower part of the recess region using the first spacer as an etching mask to form a first recess; (e) forming a second spacer at a sidewall of the first spacer and the first recess; (f) etching the semiconductor substrate exposed at the lower part of the first recess by the second spacer as an etching mask to form a second recess, wherein a recess channel region including vertical silicon-on-insulator (SOI) channel structures is formed in the second recess, wherein the vertical SOI channel structures are formed at sidewalls of both device isolation structures in the longitudinal direction of a gate region; (g) removing the first spacer, the second spacer, and the pad insulating film to expose the semiconductor substrate; (h) forming a gate insulating film over the exposed semiconductor substrate; and (i) forming a gate structure over the gate insulating film of the gate region, wherein the gate structure includes a stacked structure of a gate electrode filling the recess channel region and a gate hard mask layer pattern.

BRIEF DESCRIPTION OF THE DRAWINGS

FIGS. 5(i), 5(ii), and 7 are simplified cross-sectional views illustrating a semiconductor device according to an embodiment of the present invention.

DESCRIPTION OF SPECIFIC EMBODIMENTS

The present invention relates to a semiconductor device and a method for fabricating the same wherein a recess channel region including vertical silicon-on-insulator (SOI) channel structures, which are disposed at sidewalls of both device isolation structures under a gate in a longitudinal direction of a gate region, is formed, thereby increasing a channel area of the device and decreasing its leakage current. Accordingly, the short channel effect (SCE) and refresh characteristic of the device can be improved.

Figure 1:
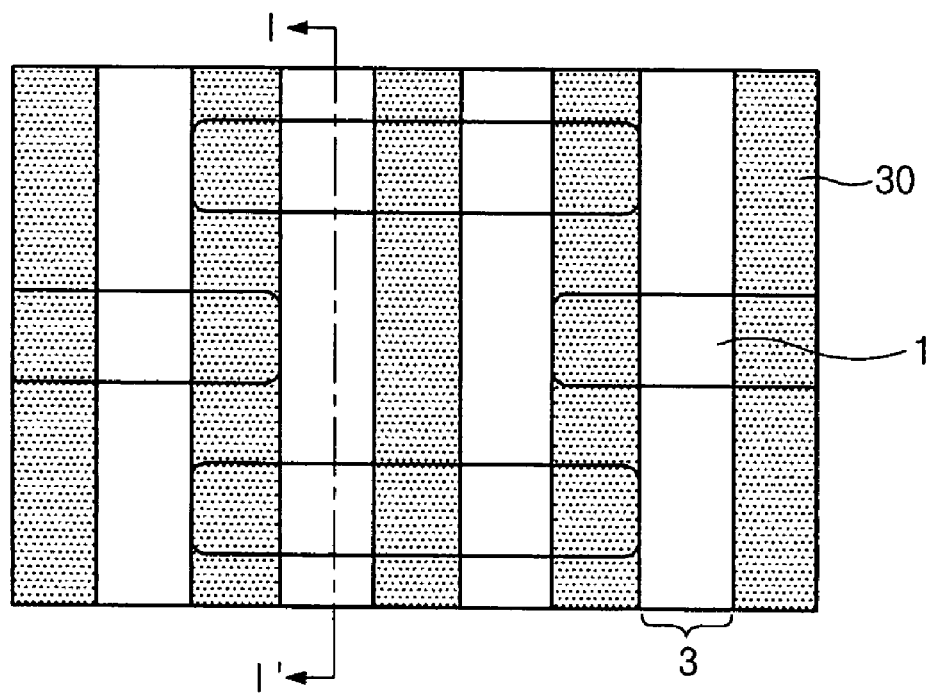
FIG. 1 is a simplified layout of a semiconductor device.
Figure 2A:
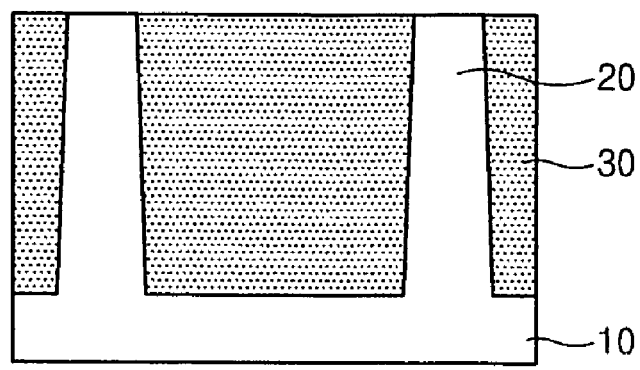
FIGS. 2a through 2c are simplified cross-sectional views illustrating a method for fabricating a semiconductor device.
Figure 2B:
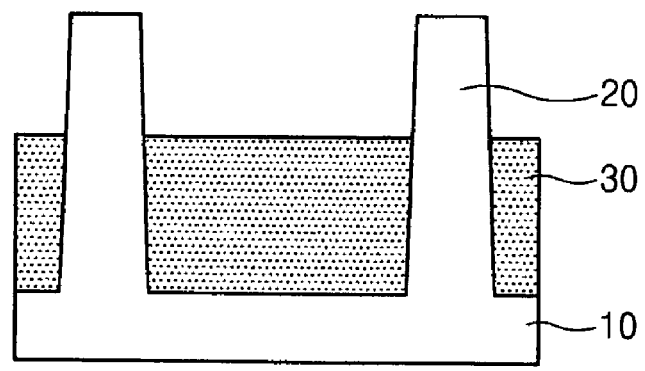
Figure 2C:
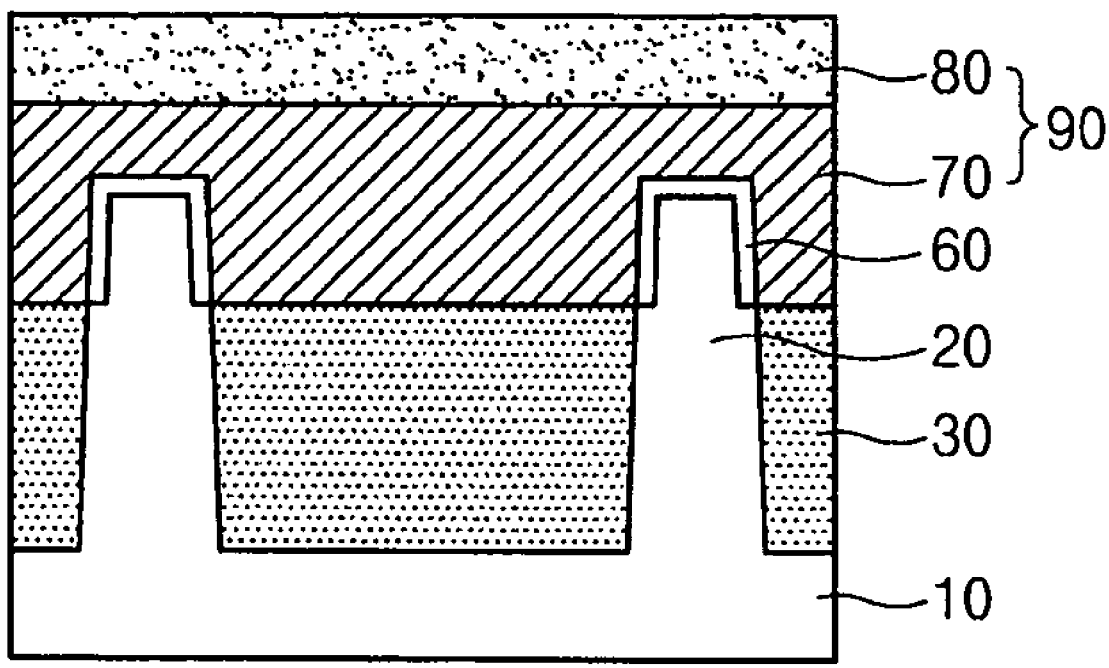
Figure 3:
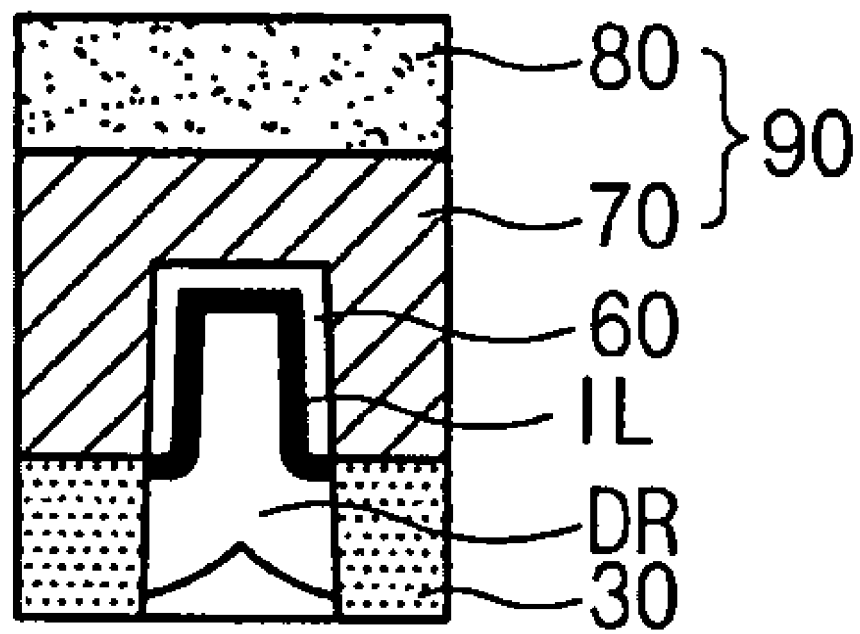
FIG. 3 is a simplified cross-sectional view illustrating a semiconductor device.
Figure 4:
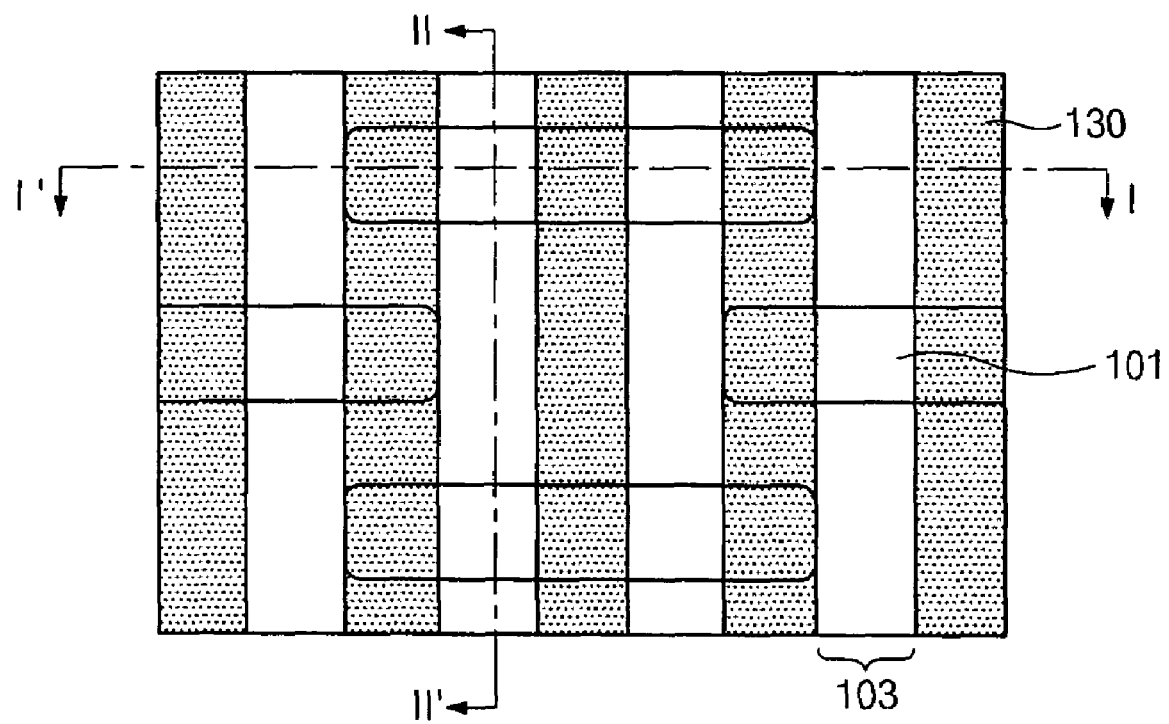
FIG. 4 is a simplified layout of a semiconductor device according to an embodiment of the present invention.

FIG. 4 is a simplified layout of a semiconductor device according to an embodiment of the present invention, wherein reference numerals 101 and 103 denote an active region defined by the device isolation structure 130 and a gate region, respectively.

Figure 5:
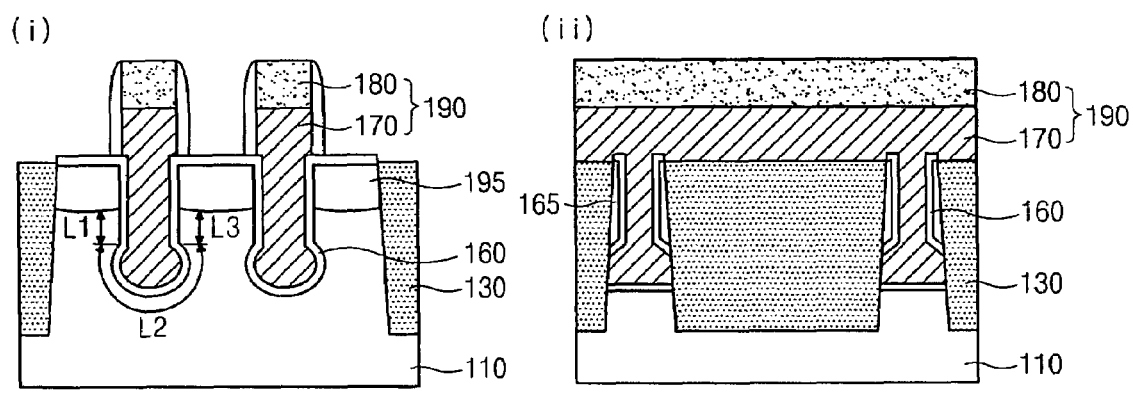

FIGS. 5(i) and 5(ii) are simplified cross-sectional views of a semiconductor device according to an embodiment of the present invention, wherein FIG. 5(i) is a cross-sectional view taken along a longitudinal direction in accordance with the line I-I' of FIG. 4 and FIG. 5(ii) is a cross-sectional view taken along a latitudinal direction in accordance with the line II-II' of FIG. 4.

Referring to FIGS. 5(i) and 5(ii), a device isolation structure 130 defining the active region 101 shown in FIG. 4 is formed in a semiconductor substrate 110. A recess channel region (L1+L2+L3) is formed in the active region 101 shown in FIG. 4. In one embodiment of the present invention, the recess channel region (L1+L2+L3) includes vertical silicon-on-insulator (SOI) channel structures 165, which are disposed at sidewalls of both device isolation structures 130 in a longitudinal direction of a gate region 103 shown in FIG. 4. In a longitudinal direction of the active region 101 of FIG. 4, the recess channel region (L1+L2+L3) includes vertical channel regions L1 and L3 and a horizontal channel region L2. In another embodiment of the present invention, the vertical SOI channel structures 165 are separated from the semiconductor substrate 110 at the lower part of the recess channel region in a vertical direction by a predetermined distance ranging from about 5 nm through about 200 nm. Thicknesses of the vertical SOI channel structures 165 range from about 1 nm to about 500 nm in a longitudinal direction of the gate region 103 shown in FIG. 4.

In addition, a gate insulating film 160 is disposed over the active region 101 of FIG. 4 including the recess channel region. A gate structure 190 corresponding to the gate region 103 (FIG. 4) is disposed over the gate insulating film 160. In one embodiment of the present invention, the gate structure 190 includes a stacked structure of a gate electrode 170 filling the recess channel region and a gate hard mask layer pattern 180. The gate electrode 170 includes a stacked structure of a lower gate electrode (not shown) and an upper gate electrode (not shown). In another embodiment of the present invention, the lower gate electrode is a polysilicon layer doped with impurity ions such as P or B. The upper gate electrode is selected from the group consisting of a titanium (Ti) layer, a titanium nitride (TiN) film, a tungsten (W) layer, an aluminum (Al) layer, a copper (Cu) layer, a tungsten silicide ($WSi_x$) layer or combinations thereof.

Figure 7:
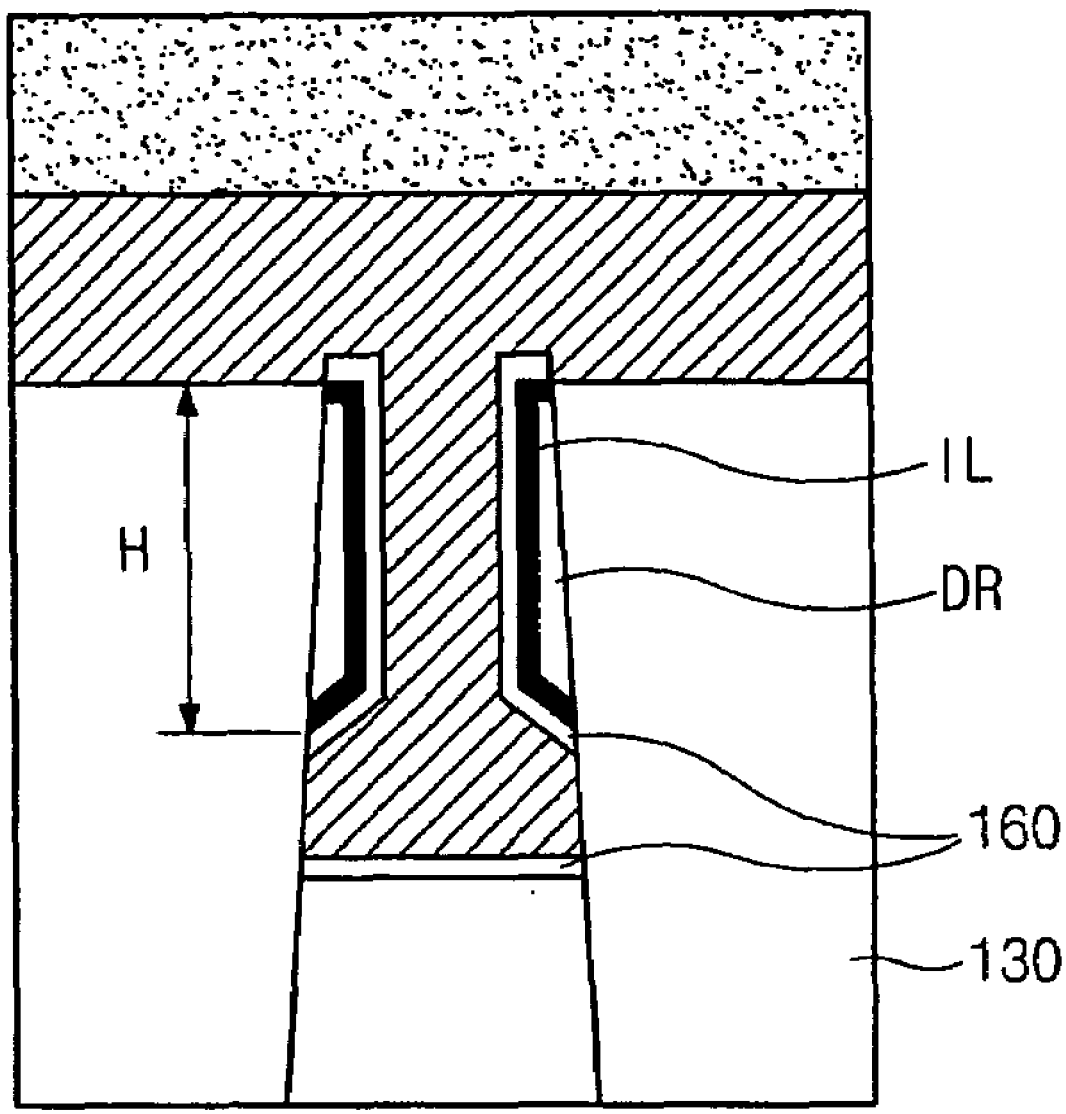

FIG. 7 is a simplified cross-sectional view illustrating a semiconductor device according to the present invention, which shows the recess channel region under the gate structure 190 in detail.

Referring to FIG. 7, the recess channel region includes vertical SOI channel structures disposed at sidewalls of both device isolation structures 130 in a longitudinal direction of the gate region 103 shown in FIG. 4. When a voltage above the threshold voltage is applied to the gate, an inversion layer IL and a depletion region DR are formed in the vertical SOI channel structures. Since the vertical SOI channel structures are thin, a complete depletion region is formed, which results in improving the short channel effect (SCE) of the device. In addition, due to the vertical SOI channel structures, a contact area between the gate and source/drain regions is shrunk to minimize leakage current of the device. As a result, the gate-induced drain leakage (GIDL) characteristic of the device can be improved. Accordingly, the short channel effect (SCE) of the device can be improved, and its leakage current can be minimized.

Figure 6A:
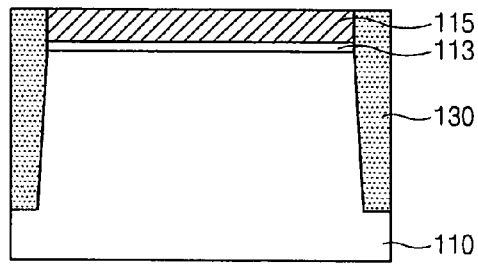
FIGS. 6a through 6i are simplified cross-sectional views illustrating a method for fabricating a semiconductor device according to an embodiment of the present invention.
Figure 6A:
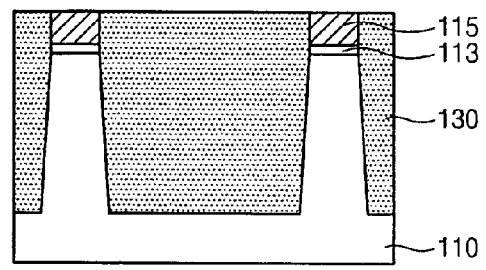

FIGS. 6a through 6i are simplified cross-sectional views illustrating a method for fabricating a semiconductor device according to an embodiment of the present invention, wherein FIGS. 6a(i) through 6i(i) are cross-sectional views taken along a longitudinal direction in accordance with the line I-I' of FIG. 4 and FIGS. 6a(ii) through 6i(ii) are cross-sectional views taken along a latitudinal direction in accordance with the line II-II' of FIG. 4.

Referring to FIG. 6a, a pad oxide film 113 and a pad nitride film 115 are formed over a semiconductor substrate 110. The pad nitride film 115, the pad oxide film 113, and the semiconductor substrate 110 are etched using a device isolation mask (not shown) as an etching mask to form a trench (not shown) defining an active region. An insulating film for device isolation (not shown) is formed over an entire surface of the resulting structure to fill up the trench. The insulating film for device isolation is polished until the pad nitride film 115 is exposed to form a device isolation structure 130. In one embodiment of the present invention, the insulating film for device isolation is a silicon oxide film. In addition, a polishing process for the device isolation structure 130 is performed by a chemical mechanical polishing (CMP) method.

Figure 6B:
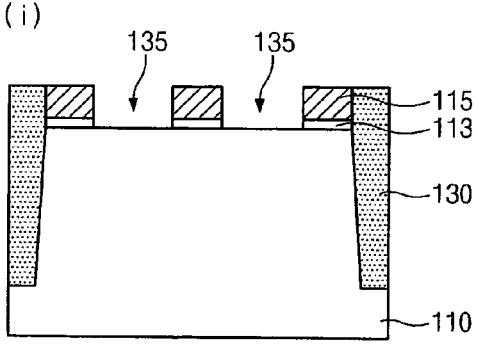
Figure 6B:
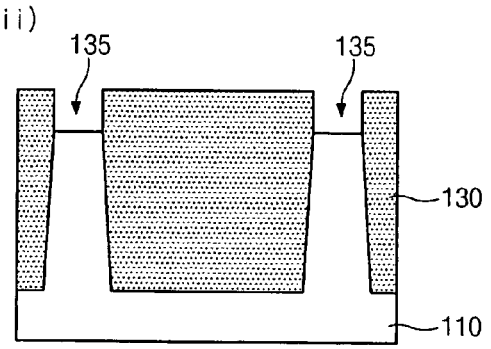
Figure 6C:
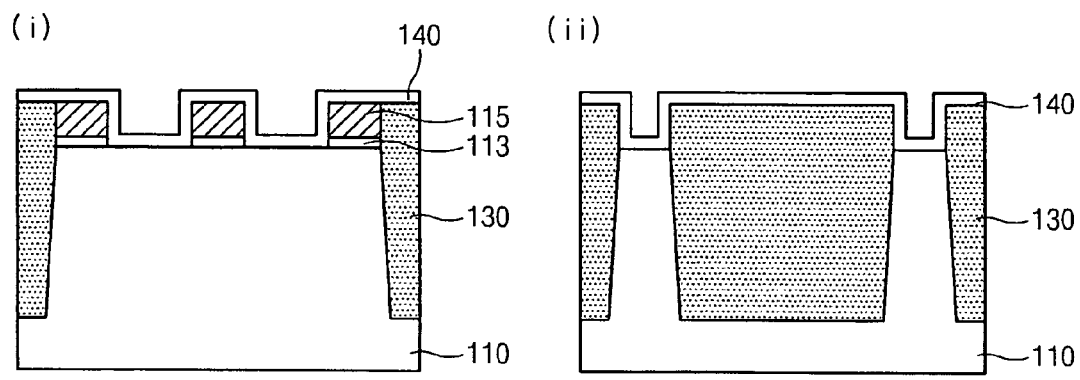
Figure 6D:
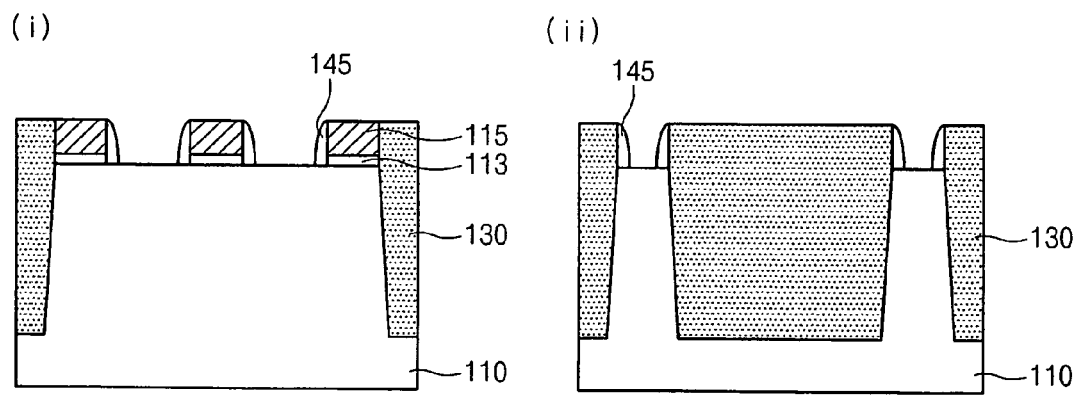

Referring to FIGS. 6b through 6d, the pad nitride film 115 and the pad oxide film 113 are etched using a recess gate mask (not shown) defining a gate region 103 shown in FIG. 4 as an etching mask to expose the semiconductor substrate 10 of a recess region 135. A first insulating film 140 is formed over an entire surface of the resulting structure. The first insulating film 140 is etched to form a first spacer 145 on a sidewall of the recess region 135. In one embodiment of the present invention, the first insulating film 140 is selected from the group consisting of a silicon nitride film, a silicon oxide film, a polysilicon layer or combinations thereof with its thickness ranging from about 1 nm to about 50 nm. In addition, a process for forming the first insulating film 140 is performed by a chemical vapor deposition (CVD) method using a source gas including $SiH_4$, $O_2$, $N_2O$, $Si(OC_2H_5)_4$, $SiH_2Cl_2$, $NH_3$, $N_2$, He or combinations thereof. Further, the etching process for the first spacer 145 is performed by a plasma method using a gas including $C_xF_yH_z$, $O_2$, HCl, Ar, He or combinations thereof.

Figure 6E:
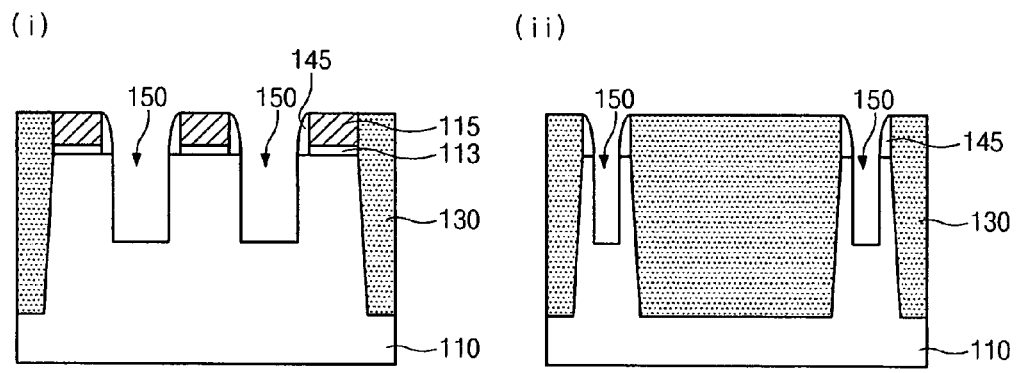
Figure 6F:
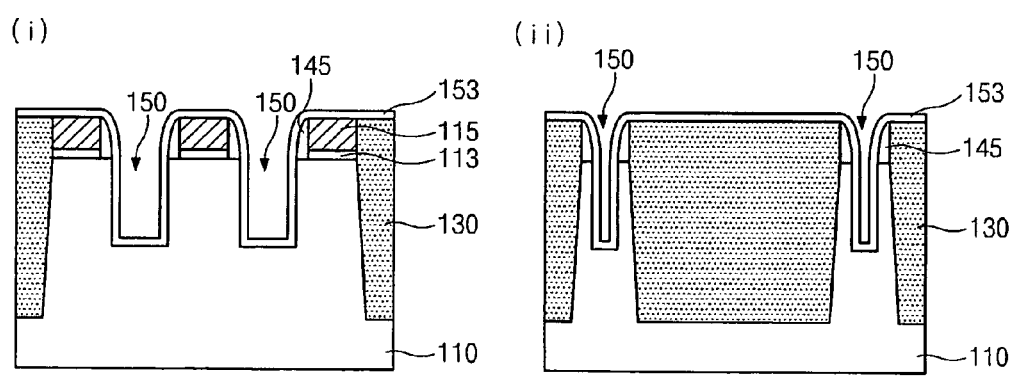
Figure 6G:
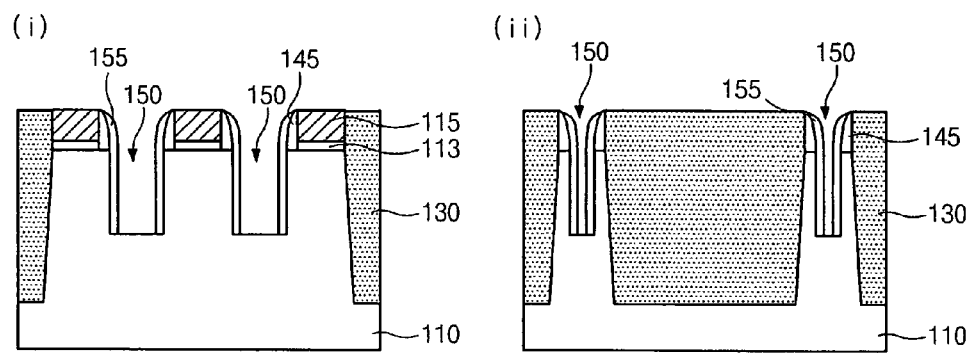

Referring to FIGS. 6e through 6g, the semiconductor substrate 110 exposed at the lower part of the recess region 135 is etched using the first spacer 145 as an etching mask to form a first recess 150. A second insulating film 153 is formed over an entire surface of the resulting structure. The second insulating film 153 is etched to form a second spacer 155 on a sidewall of the first recess 150 and the first spacer 145. In one embodiment, the etching process for the first recess 150 is performed by a plasma method, and the second insulating film 153 is selected from the group consisting of a silicon nitride film, a silicon oxide film, a polysilicon layer or combinations thereof with its thickness ranging from about 1 nm to about 50 nm. In addition, a process for forming the second insulating film 153 is performed by a chemical vapor deposition (CVD) method using a source gas including $SiH_4$, $O_2$, $N_2O$, $Si(OC_2H_5)_4$, $SiH_2Cl_2$, $NH_3$, $N_2$, He or combinations thereof. Further, the etching process for the second spacer 155 is performed by a plasma method using a gas including $C_xF_yH_z$, $O_2$, HCl, Ar, He or combinations thereof.

Figure 6H:
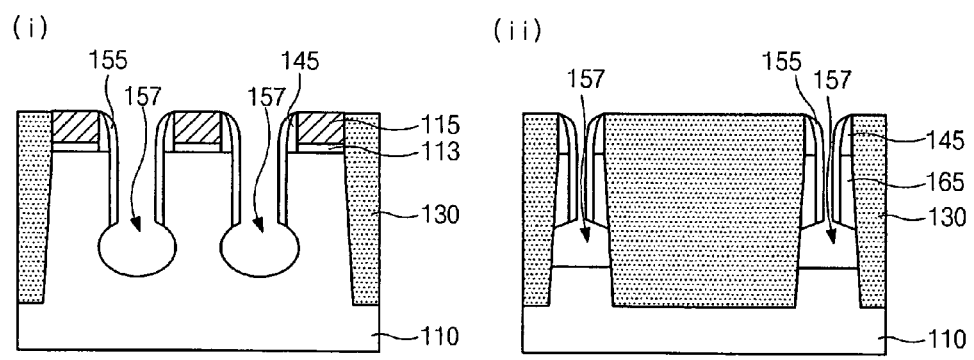

Referring to FIG. 6h, the semiconductor substrate 110 exposed at the lower part of the first recess 150 is etched using the second spacer 155 as an etching mask to form a second recess 157. At this time, a recess channel region including vertical silicon-on-insulator (SOI) channel structures 165 is formed in the second recess 157, wherein the vertical SOI channel structures 165 are formed at sidewalls of both device isolation structures 130 in a longitudinal direction of the gate region 103 shown in FIG. 4. In one embodiment of the present invention, the etching process for the second recess 157 is performed by an isotropic etching method. In addition, the thicknesses of the vertical SOI channel structures 165 in a longitudinal direction of the gate region 103 range from about 1 nm to about 50 nm. Further, the vertical SOI channel structures 165 are separated from the semiconductor substrate 110 at the lower part of the second recess 157 in a vertical direction by a predetermined distance ranging from about 5 nm to about 200 nm.

Figure 6I:
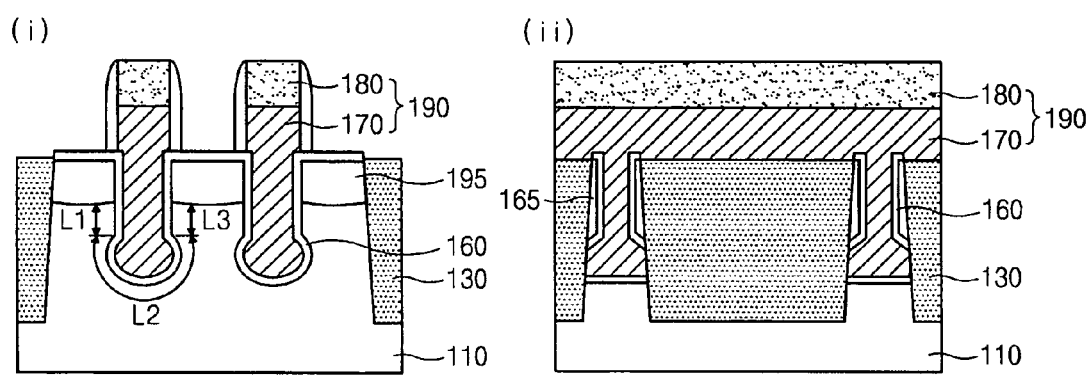

Referring to FIG. 6i, the second spacer 155, the first spacer 145, the pad nitride film 115 and the pad oxide film 113 are removed to expose the semiconductor substrate 110 including the second recess 157 and the first recess 150. A gate insulating film 160 is formed over the exposed semiconductor substrate 110. A lower gate conductive layer (not shown) is formed over an entire surface of the resulting structure to fill up the first recess 150 and the second recess 157. An upper gate conductive layer (not shown) and a gate hard mask layer (not shown) are formed over the lower gate conductive layer. The gate hard mask layer, the upper gate conductive layer, and the lower gate conductive layer are patterned using a gate mask (not shown) as an etching mask to form a gate structure 190 comprising a stacked structure of a gate electrode 170 and a gate hard mask layer pattern 180. Gate spacers (not shown) are formed on sidewalls of the gate structure 190. Impurity ions are injected into the semiconductor substrate 110 at both sides of the gate structure 190 including the gate spacer to form source/drain regions 195. In one embodiment, a process for cleaning the exposed semiconductor substrate 110 can be performed by a solution including HF before the formation of the gate insulating film 160. In addition, the gate insulating film 160 is formed using a gas including $O_2$, $H_2O$, $O_3$ or combinations thereof with its thickness ranging from about 1 nm to about 10 nm. In another embodiment, the lower gate conductive layer is formed of a polysilicon layer doped with impurity ions such as P or B. Here, the doped polysilicon layer is formed by implanting impurity ions into an undoped polysilicon or by using a silicon source gas and an impurity source gas including P or B. In addition, the upper gate conductive layer is selected from the group consisting of a titanium (Ti) layer, a titanium nitride (TiN) film, a tungsten (W) layer, an aluminum (Al) layer, a copper (Cu) layer, a tungsten silicide ($WSi_x$) layer or combinations thereof.

In addition, subsequent processes such as a process for forming a landing plug, a process for forming a bit line contact and a bit line, a process for forming a capacitor, and a process for forming an interconnect may be performed.

As described above, the semiconductor substrate and method for fabricating the same in accordance with an embodiment of the present invention provides forming a recess channel region including vertical SOI channel structures on sidewalls of both device isolation structures under a gate structure, thereby obtaining relatively large driving current. In addition, threshold voltage drop resulted from drain voltage, body effect, and gate On/Off characteristics can be improved due to the vertical SOI structures. According to the present invention, the semiconductor substrate has extendibility capable of securing substantial channel area of the device despite being smaller than specified in its design rules. The conventional gate mask may be used for forming the recess region. As a result, the process cost can be reduced. The process is made simple, which results in decreasing the number of defective devices.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A method for fabricating a semiconductor device comprising:
    (a) forming a device isolation structure in a semiconductor substrate having a pad insulating film;
    (b) selectively etching the pad insulating film by a recess gate mask to expose the semiconductor substrate of a recess region;
    (c) forming a first spacer at a sidewall of the recess region;
    (d) etching a predetermined thickness of the semiconductor substrate exposed at the lower part of the recess region using the first spacer as an etching mask to form a first recess;
    (e) forming a second spacer at a sidewall of the first spacer and the first recess;
    (f) etching the semiconductor substrate exposed at the lower part of the first recess by the second spacer as an etching mask to form a second recess, wherein a recess channel region including vertical silicon-on-insulator (SOI) channel structures is formed in the second recess, wherein the vertical SOT channel structures are fanned at sidewalls of both device isolation structures in the longitudinal direction of a gate region;
    (g) removing the first spacer, the second spacer, and the pad insulating film to expose the semiconductor substrate;
    (h) forming a gate insulating film over the exposed semiconductor substrate; and
    (i) forming a gate structure over the gate insulating film of the gate region, wherein the gate structure includes a stacked structure of a gate electrode filling the recess channel region and a gate hard mask layer pattern.

2. The method according to claim 1, wherein the pad insulating film is selected from the group consisting of a silicon nitride film, a silicon oxide film, a polysilicon layer and combinations thereof.

3. The method according to claim 1, wherein step (a) includes:
    (a-1) etching the pad insulating film and the semiconductor substrate using a device isolation mask as an etching mask to form a trench defining an active region;
    (a-2) forming an insulating film for device isolation over an entire surface of the active region to fill up the trench;
    (a-3) polishing the insulating film until either a pad nitride film or a pad silicon oxide film is exposed to form the device isolation structure.

4. The method according to claim 3, wherein the pad insulating film is selected from the group consisting of a silicon nitride film, a silicon oxide film, a polysilicon layer and combinations thereof.

5. The method according to claim 4, wherein the first insulating film has a thickness ranging from about 1 nm to 50 nm.

6. The method according to claim 4, wherein polishing the insulating film to form the device isolation structure is performed by a CMP method.

7. The method according to claim 1, wherein step (c) includes:
   (c-1) fanning a first insulating film over an entire surface of the resulting structure; and
   (c-2) etching the first insulating film to form the first spacer at a sidewall of the recess region.

8. The method according to claim 7, wherein the first insulating film is selected from the group consisting of a silicon nitride film, a silicon oxide film, a polysilicon layer and combinations thereof.

9. The method according to claim 8, wherein the first insulating film has a thickness ranging from about 1 nm to about 50 nm.

10. The method according to claim 8, wherein the first insulating film is formed by a CVD method using a source gas including $SiH_4$, $O_2$, $N_2O$, $Si(OC_2H_5)_4$, $SiH_2Cl_2$, $NH_3$, $N_2$, He, and combinations thereof.

11. The method according to claim 7, wherein the etching process for the first insulating film is performed by a plasma etching method using a gas including $C_xF_yH_z$, $O_2$, HCl, Ar, He, and combinations thereof.

12. The method according to claim 1, wherein the etching process for forming the first recess is performed by a plasma etching method.

13. The method according to claim 1, wherein a thickness of the etched semiconductor substrate ranges from about 5 nm to about 200 nm during the process of forming the first recess.

14. The method according to claim 1, wherein step (e) includes:
   (e-1) forming a second insulating film over an entire surface of the resulting structure; and
   (e-2) etching the second insulating film to form a second spacer at a sidewall of the first recess and the first spacer.

15. The method according to claim 14, wherein the second insulating film is selected from the group consisting of a silicon nitride film, a silicon oxide film, a polysilicon layer and combinations thereof with its thickness ranging from about 1 nm to about 50 nm.

16. The method according to claim 15, wherein the second insulating film is formed by a CVD method using a source gas including $SiH_4$, $O_2$, $N_2O$, $Si(OC_2H_5)_4$, $SiH_2Cl_2$, $NH_3$, $N_2$, He, and combinations thereof.

17. The method according to claim 14, wherein the etching process for the second insulating film is performed by a plasma etching method using a gas including $C_xF_yH_z$, $O_2$, HCl, Ar, He, and combinations thereof.

18. The method according to claim 1, wherein the etching process for forming the second recess is performed by an isotropic etching method.

19. The method according to claim 1, wherein the vertical SOI channel structures are separated from the semiconductor substrate at the lower part of the recess channel region in a vertical direction by a predetermined distance.

20. The method according to claim 19, wherein the predetermined distance ranges from about 5 nm to about 200 nm.

21. The method according to claim 1, further comprising cleaning the exposed semiconductor substrate using a solution including HF.

22. The method according to claim 1, wherein the gate insulating film is formed using a gas including $O_2$, $H_2O$, $O_3$, and combinations thereof with its thickness ranging from about 1 nm to about 10 nm.

23. The method according to claim 1, wherein step (i) includes
   (i-1) forming a lower gate conductive layer over an entire surface of the resulting structure to fill the first recess and the second recess;
   (i-2) forming an upper gate conductive layer and a gate hard mask layer over the lower gate conductive layer; and
   (i-3) patterning the gate hard mask layer, the upper gate conductive layer, and the lower gate conductive layer by a gate mask to form a gate structure, wherein the gate structure comprises the stacked structure of a gate electrode and a gate hard mask layer pattern.

24. The method according to claim 23, wherein the lower gate conductive layer is formed of a polysilicon layer doped with impurity ions.

25. The method according to claim 24, wherein the impurity ions include P or B.

26. The method according to claim 23, wherein the upper gate conductive layer is selected from the group consisting of a titanium layer, a titanium nitride layer, a tungsten layer, an aluminum layer, a copper layer, a tungsten silicide layer and combinations thereof.

* * * * *